(12) United States Patent
Chung et al.

(10) Patent No.: US 7,830,187 B2
(45) Date of Patent: Nov. 9, 2010

(54) DELAY LOCKED LOOP CIRCUIT

(75) Inventors: Jin-Il Chung, Gyeonggi-do (KR); Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/327,745

(22) Filed: Dec. 3, 2008

(65) Prior Publication Data

US 2010/0052745 A1 Mar. 4, 2010

(30) Foreign Application Priority Data

Sep. 2, 2008 (KR) .................. 10-2008-0086109

(51) Int. Cl.
H03L 7/06 (2006.01)
(52) U.S. Cl. ................... 327/158; 327/149
(58) Field of Classification Search ........... 327/149, 327/158
See application file for complete search history.

(56) References Cited

U.S. PATENT DOCUMENTS

| 6,452,432 | B2 * | 9/2002 | Kim .................. 327/158 |
| 6,956,418 | B2 | 10/2005 | Kwak et al. |
| 7,282,974 | B2 * | 10/2007 | Lee .................. 327/158 |
| 7,358,784 | B2 * | 4/2008 | Kim et al. .......... 327/158 |
| 7,388,415 | B2 * | 6/2008 | Lee .................. 327/158 |
| 7,449,930 | B2 * | 11/2008 | Hur .................. 327/158 |
| 7,489,171 | B2 * | 2/2009 | Song ................ 327/158 |
| 7,567,103 | B2 * | 7/2009 | Park et al. ........ 327/158 |
| 7,598,783 | B2 * | 10/2009 | Shin et al. ......... 327/158 |
| 7,633,323 | B2 * | 12/2009 | Lee .................. 327/158 |
| 2005/0024107 | A1 * | 2/2005 | Takai et al. ........ 327/158 |
| 2007/0069775 | A1 * | 3/2007 | Ku et al. ........... 327/158 |
| 2007/0069776 | A1 * | 3/2007 | Hur ................. 327/158 |
| 2007/0069781 | A1 * | 3/2007 | Kim et al. ......... 327/158 |
| 2007/0188206 | A1 * | 8/2007 | Lee .................. 327/158 |
| 2008/0136476 | A1 * | 6/2008 | Ku .................. 327/158 |
| 2008/0169853 | A1 * | 7/2008 | Park et al. ........ 327/158 |
| 2010/0052745 | A1 * | 3/2010 | Chung et al. ....... 327/149 |

FOREIGN PATENT DOCUMENTS

| KR | 1020030090129 A | 11/2003 |
| KR | 1020060000866 A | 1/2006 |
| KR | 1020070036641 A | 4/2007 |
| KR | 1020080001124 A | 1/2008 |

OTHER PUBLICATIONS

Notice of Allowance issued from Korean Intellectual Property Office on Jan. 29, 2010.

* cited by examiner

Primary Examiner—Lincoln Donovan
Assistant Examiner—Adam D Houston
(74) Attorney, Agent, or Firm—IP & T Group LLP

(57) ABSTRACT

A delay locked loop circuit includes a delay locking unit configured to output a first internal clock and a second internal clock, a rising edge of which is synchronized with that of the first internal clock by delaying a compensated external clock for compensating a skew of a semiconductor memory device; a duty ratio compensation unit configured to generate the compensated external clock by compensating a duty ratio of an external clock of the semiconductor memory device and to compensate duty ratios of the first and second internal clocks; and a clock control unit configured to control an activation state of the second internal clock after the duty ratio compensation of the external clock.

13 Claims, 5 Drawing Sheets

DELAY LOCKED LOOP CIRCUIT

CROSS-REFERENCE TO RELATED APPLICATIONS

The present invention claims priority of Korean patent application number 10-2008-0086109, filed on Sep. 2, 2008, which is incorporated by reference in its entirety.

BACKGROUND OF THE INVENTION

The present invention relates to a delay locked loop circuit, and more particularly, to a delay locked loop circuit capable of reducing power consumption.

Generally, a Delay Locked Loop (DLL) circuit controls a timing of data outputted from a memory device, e.g., a synchronous semiconductor memory device, by using an external clock inputted from the outside of the memory device.

In order to transfer the output data of the semiconductor memory device to a chip set without an error, the semiconductor memory device and the chip set should be synchronized with the external clock. However, since the external clock inputted to the semiconductor memory device is delayed by an internal circuit of the semiconductor memory device, a phase difference is generated between the external clock and an internal clock. The DLL circuit compensates the clock skew generated by the internal circuit of the semiconductor memory device in order to eliminate the phase difference between the data outputted from the semiconductor memory device and the clock.

FIG. 1 is a block diagram depicting a conventional delay locked loop circuit.

As shown in the drawing, the conventional delay locked loop circuit includes a first delay locking unit 101, a second delay locking unit 111 and a duty ratio compensation unit 121.

The first delay locking unit 101 includes a first phase comparison unit 103, a first delay control unit 105 and a first replica model unit 107. The second delay locking unit 111 includes a second phase comparison unit 113, a second delay control unit 115 and a second replica model unit 117.

The first phase comparison unit 103 compares a phase of an external clock EXT_CLK with that of a first feedback clock FB_1 outputted from the first replica model unit 107 in order to generate a first comparison signal CMP_1 which includes information about a phase difference between the external clock EXT_CLK and the first feedback clock FB_1. A clock delay component inside a semiconductor device is modeled in the first replica model unit 107. The first replica model unit 107 receives a first internal clock CLKOUT_1 whose duty ratio is compensated by a second compensation unit 125 mentioned later in order to output the first feedback clock FB_1.

The first comparison signal CMP_1 is inputted to the first delay control unit 105. The first delay control unit 105 outputs a first internal clock CLK_1 by delaying a compensated external clock CLK_CC generated by a first compensation unit 123 mentioned later based on the first compensation signal CMP_1. Herein, the first compensation unit 123 generates the compensated external clock CLK_CC by compensating a duty ratio of the external clock EXT_CLK.

As a result, through the above-mentioned processes, delays due to the first delay control unit 105 and the first replica model unit 107 are reflected to the first feedback clock FB_1, and thus a phase of the first feedback clock FB_1 is synchronized with that of the compensated external clock CLK_CC. At this time, the first internal clock CLK_1, to which a delay due to the first delay control unit 105 is reflected, is delay-locked, i.e., a locking is completed.

The second delay locking unit 111 performs a similar operation to the first delay locking unit 101 in order to synchronize a phase of the external clock EXT_CLK with that of a second feedback clock FB_2 and output a second delay-locked internal clock CLK_2. However, since the second delay control unit 115 outputs the second internal clock CLK_2 after inverting it, a rising edge of the second internal clock CLK_2 is synchronized with that of the first internal clock CLK_1 and a duty ratio of the second internal clock CLK_2 is opposite to that of the first internal clock CLK_1. That is because the second delay control unit 115 performs an operation related to a duty ratio compensating operation of the second compensation unit 125 mentioned later. In FIG. 1, the circle at the output terminal of the second delay control unit 115 means an inversion.

The duty ratio compensation unit 121 includes the first compensation unit 123, the second compensation unit 125, a duty ratio sensing unit 127 and a compensation control unit 129.

The duty ratio compensating operation is performed after the locking operation and is controlled by the compensation control unit 129. After the locking operation, the compensation control unit 129 activates a compensation signal DCC_EN so that the duty ratio compensating operation is performed by the first and second compensation units 123 and 125 in response to the compensation signal DCC_EN.

The duty ratio sensing unit 127 detects duty ratios of the first and second internal clocks CLK_1 and CLK_2 in order to generate a detection signal PD. The compensation control unit 129 outputs a control signal DCC_CTRL which includes duty ratio adjustment information to the compensation unit 123 in response to the detection signal PD. The first compensation unit 123 compensates a duty ratio of the external clock EXT_CLK in order to generate the compensated external clock CLK_CC in response to the control signal DCC_CTRL.

The second compensation unit 125 mixes phases of falling edges of the first and second internal clocks CLK_1 and CLK_2 to a medium phase in order to output the duty ratio compensated first and second internal clocks CLKOUT_1 and CLKOUT_2. The second compensation unit 125, unlike the first compensation unit 123, is operated only when a dual compensation signal DUAL_EN inputted from the outside of the conventional delay locked loop circuit is activated. In case of improving a duty ratio compensating ability of the conventional delay locked loop circuit, the dual compensation signal DUAL_EN can be set to be activated.

After completing the locking operation and the duty ratio compensating operation through the above-mentioned processes, the first and second internal clocks CLKOUT_1 and CLKOUT_2 are kept in the completed state of the locking and duty ratio compensating operations. Thereafter, the conventional delay locked loop circuit performs an updating process to output the first and second internal clocks CLKOUT_1 and CLKOUT_2 by periodically reflecting a change.

FIG. 2 is a diagram illustrating an operation of the conventional delay locked loop circuit shown in FIG. 1 when the dual compensation signal DUAL_EN is deactivated. The arrow indicates an enablement of each unit at each operation step of the conventional delay locked loop circuit.

If the operation of the conventional delay locked loop circuit is started, the first and second internal clocks CLK_1 and CLK_2 are delay-locked by the first and second delay locking units 101 and 111 respectively. Thereafter, the duty ratio compensating operation is performed by the first compensation unit 123. Since the first and second delay locking units 101 and 111 are still enabled after the locking operation, the duty ratio sensing unit 127 generates the detection signal PD by detecting duty ratios of the first and second internal clocks CLK_1 and CLK_2, and the first compensation unit 123 compensates a duty ratio of the external clock EXT_CLK in response to the control signal DCC_CTRL.

In case the dual compensation signal DUAL_EN is deactivated, unlike when the dual compensation signal DUAL_EN is activated, the operation of the conventional delay locked loop circuit is not influenced, even if the second delay locking unit 111 is disabled except for the update process after the completion of the duty ratio compensation. However, as shown in the drawing, even after the duty ratio compensating operation of the first compensation unit 123 is completed, the second delay locking unit 111 is still enabled. Since the compensated external clock CLK_CC inputted to the second delay control unit 115 continuously toggles, unwanted power consumption occurs in the second delay control units 115.

As a result, according to the conventional delay locked loop circuit, even when the second compensation unit 125 is not operated, the second delay locking unit 111 is still enabled, thereby unnecessarily consuming power after the completion of the duty ratio compensating operation.

SUMMARY OF THE INVENTION

The present invention is proposed in order to overcome the above-described problems of conventional technologies. Embodiments of the present invention are directed to providing a delay locked loop circuit capable of reducing power consumption.

In accordance with an aspect of the present invention, there is provided a delay locked loop circuit, which includes: a delay locking unit configured to output a first internal clock and a second internal clock, a rising edge of which is synchronized with that of the first internal clock by delaying a compensated external clock for compensating a skew of a semiconductor memory device; a duty ratio compensation unit configured to generate the compensated external clock by compensating a duty ratio of an external clock of the semiconductor memory device and to compensate duty ratios of the first and second internal clocks; and a clock control unit configured to control an activation state of the second internal clock after the duty ratio compensation of the external clock.

In accordance with another aspect of the present invention, there is provided a delay locked loop circuit, which includes: a delay locking unit configured to output a first internal clock and a second internal clock, a rising edge of which is synchronized with that of the first internal clock by delaying a compensated external clock for compensating a skew of a semiconductor memory device; a duty ratio compensation unit configured to generate the compensated external clock by compensating a duty ratio of an external clock of the semiconductor memory device and to compensate duty ratios of the first and second internal clocks; a clock control unit configured to disable toggling of the second internal clock in response to a clock control signal; and a locking control unit configured to determine activation of the clock control signal after the duty ratio compensation of the external clock is completed.

In accordance with still another aspect of the present invention, there is provided a delay locked loop circuit, comprising: a delay locking unit configured to output a first internal clock and a second internal clock, a rising edge of which is synchronized with that of the first internal clock by delaying a compensated external clock for compensating a skew of a semiconductor memory device; and a duty ratio compensation unit configured to generate the compensated external clock by compensating a duty ratio of an external clock of the semiconductor memory device and to compensate duty ratios of the first and second internal clocks, wherein the delay locking unit deactivates the second internal clock after compensating the duty ratio of the external clock.

DESCRIPTION OF SPECIFIC EMBODIMENTS

In order to describe in detail such that those skilled in the art easily implement the spirit and scope of the present invention, the embodiment of the present invention will be described with reference to the accompanying drawings.

Figure 3:
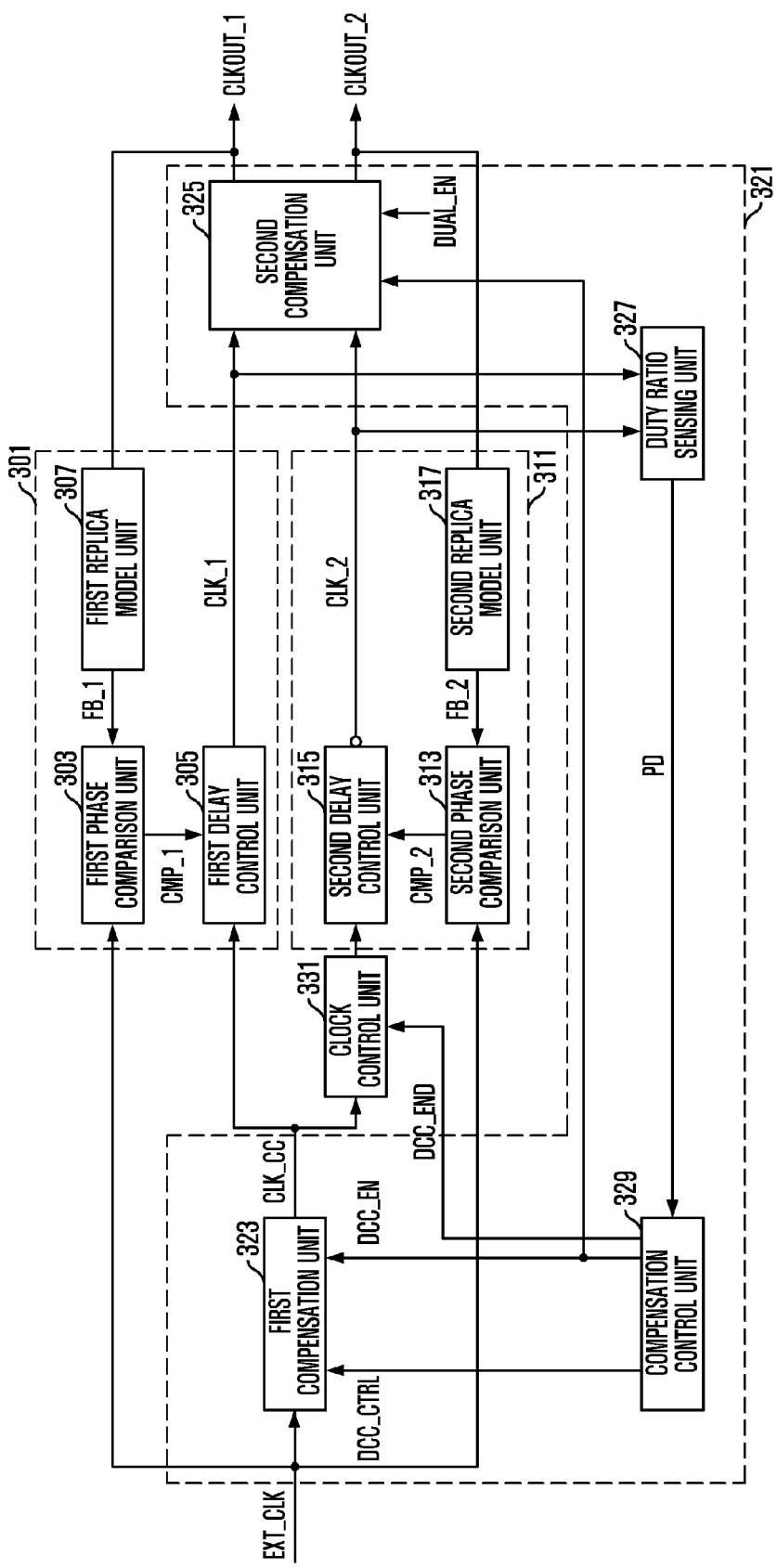
FIG. 3 is a block diagram depicting a delay locked loop circuit in accordance with an embodiment of the present invention.

FIG. 3 is a block diagram depicting a delay locked loop circuit in accordance with an embodiment of the present invention.

As shown in the drawing, the delay locked loop circuit includes a first delay locking unit 301, a second delay locking unit 311, a duty ratio compensation unit 321 and a clock control unit 331.

Operations of the first and second delay locking units 301 and 311 and the duty ratio compensation unit 321 are similar to those of the first and second delay locking units 101 and 111 and the duty ratio compensation unit 121 of the conventional delay locked loop circuit. However, in case that a second compensation unit 325 is not operated due to deactivation of a dual compensation signal DUAL_EN, the duty ratio compensation unit 321 activates a compensation finishing signal DCC_END and outputs the activated compensation finishing signal DCC_END into the clock control unit 331 if the duty ratio compensation operation of a first compensation unit 323 is completed. Unlike the related art, the delay locked loop circuit in accordance with the present invention includes the clock control unit 331. The clock control unit 331 deactivates a second internal clock CLK_2 by disabling the second delay locking unit 311 if the compensation finishing signal DCC_END is activated. Therefore, the delay locked loop circuit in accordance with the present invention can reduce power consumption of the second delay locking unit 311 by disabling the second delay locking unit 311, which are not required to be enabled after the duty ratio compensating operation is completed. FIG. 3 illustrates one embodiment where the clock control unit 331 disables toggling of a compensated external clock CLK_CC inputted to the second delay locking unit 311 in order to disable the second delay locking unit 311.

The first delay locking unit 301 includes a first phase comparison unit 303, a first delay control unit 305 and a first replica model unit 307.

The first phase comparison unit 303 compares a phase of an external clock EXT_CLK with that of a first feedback clock FB_1 outputted from the first replica model unit 307 in order to generate a first comparison signal CMP_1. Herein, the comparison signal CMP_1 includes information about a phase difference between the external clock EXT_CLK and the first feedback clock FB_1. The first comparison signal CMP_1 is inputted to the first delay control unit 305. The first delay control unit 305 outputs a delay-locked first internal clock CLK_1 by delaying the compensated external clock CLK_CC generated by the first compensation unit 323 mentioned later based on the first comparison signal CMP_1. Herein, the first compensation unit 323 generates the compensated external clock CLK_CC by compensating a duty ratio of the external clock EXT_CLK.

Meanwhile, the compensated external clock CLK_CC is a duty ratio compensated version of the external clock EXT_CLK and a rising edge of the compensated external clock CLK_CC is synchronized with that of the external clock EXT_CLK. Therefore, a phase comparison result between the compensated external clock CLK_CC and the first feedback clock FB_1 is equal to that between the external clock EXT_CLK and the first feedback clock FB_1.

The second delay locking unit 311 includes a second phase comparison unit 313, a second delay control unit 315 and a second replicas model unit 317.

The second delay locking unit 311 performs a similar operation to the first delay locking unit 301 in order to synchronize a phase of the external clock EXT_CLK with that of a second feedback clock FB_2 and output the delay-locked second internal clock CLK_2. However, since the second delay control unit 315 performs an operation related to a duty ratio compensating operation of the second compensation unit 325 mentioned later, the second delay control unit 315 outputs the second internal clock CLK_2 after inverting it. In FIG. 3, the circule at an output terminal of the second delay control unit 315 means an inversion.

The duty ratio compensation unit 321 includes the first compensation unit 323, the second compensation unit 325, a duty ratio sensing unit 327, a compensation control unit 329 and a clock control unit 331.

The duty ratio compensating operation is performed after the locking operation and is controlled by the compensation control unit 329. There are various methods for determining whether first and second internal clocks CLKOUT_1 and CLKOUT_2 are delay-locked. For instance, in case that the first delay control unit 305 discretely, i.e., digitally, increases or decreases delay amount, it is difficult to correctly synchronize phases of the external clock EXT_CLK and the first feedback clock FB_1. Therefore, at the locking point, the first comparison signal CMP_1 controls the first delay control unit 305 to repeatedly increase or decrease the delay amount. A second comparison signal CMP_2 also controls the second delay control unit 315 to repeatedly increase or decrease the delay amount. At this time, it can be determined that the first and second internal clocks CLK_1 and CLK_2 are delay-locked.

In this case, a predetermined control signal (not shown in the drawing) generated by the first and second delay control units 305 and 315 may enable the compensation control unit 329, and the compensation control unit 329 outputs an activated compensation signal DCC_EN to the first and second compensation units 323 and 325 so that the duty ratio compensating operation is performed. The first compensation unit 323 drives the external clock EXT_CLK in the disabled state and the second compensation unit 325 drives the first and second internal clocks CLK_1 and CLK_2 in the disable state so that the above-mentioned locking operation can be normally performed.

Since rising edges of the first and second internal clocks CLK_1 and CLK_2 are synchronized with each other, the duty ratio sensing unit 327 detects a phase difference between falling edges of the first and second internal clocks CLK_1 and CLK_2 in order to generate a detection signal PD. The compensation control unit 329 outputs a control signal DCC_CTRL which includes duty ratio adjustment information to the first compensation unit 323 in response to the detection signal PD. The first compensation unit 323 compensates a duty ratio of the external clock EXT_CLK in order to generate the compensated external clock CLK_CC in response to the control signal DCC_CTRL. In an alternate embodiment, the first compensation unit 323 can directly receive the detection signal PD instead of the control signal DCC_CTRL.

Since rising edges of the first and second internal clocks CLK_1 and CLK_2 are synchronized with each other, the second compensation unit 325 mixes phases of falling edges of the first and second internal clocks CLK_1 and CLK_2 to a medium phase in order to output the duty ratio compensated first and second internal clocks CLKOUT_1 and CLKOUT_2. The second compensation unit 325, unlike the first compensation unit 323, is operated only when the dual compensation signal DUAL_EN is activated. Herein, the dual compensation signal DUAL_EN can be set according to, e.g., an MRS (Mode Register Set). The MRS is a storing device for previously storing data needed for controlling various operational modes of a semiconductor memory device. In case of improving a duty ratio compensating ability of the delay locked loop circuit, the MRS can be set to activate the dual compensation signal DUAL_EN.

In case that the duty ratio compensating operation is completed in the deactivated state of the dual compensation signal DUAL_EN, the compensation control unit 329 activates the compensation finishing signal DCC_END. The compensation control unit 329 can determine whether the duty ratio compensating operation is completed based on the detection signal PD. For instance, when a high level period of the compensated external clock CLK_CC is wider than a low level period of the compensated external clock CLK_CC, the high level period is decreased by the first compensation unit 323. Then, the compensation control unit 329 can detect the completion of the duty ratio compensating operation in response to the detection signal PD at the timing when the high level period is narrower than the low level period.

The clock control unit 331 disables toggling of the compensated external clock CLK_CC inputted to the second delay control unit 315 in response to the compensation finishing signal DCC_END. In one embodiment, the clock control unit 331 may be first and second pass gates turned-on/off in response to the compensation finishing signal DCC_END. That is, the first pass gate passes the compensated external clock CLK_CC if the compensation finishing signal DCC_END is activated at a high level. On the other hand, if the compensation finishing signal DCC_END is deactivated at a low level, the second pass gate does not pass the compensated external clock CLK_CC and fixes an input signal of the second delay control unit 315 to a ground voltage VSS.

Therefore, the delay locked loop circuit in accordance with the present invention can reduce the power consumption of the second delay locking unit 311 in comparison with the conventional delay locked loop circuit. In case that the dual compensation signal DUAL_EN is activated, the second compensation unit 325 is enabled for mixing phases of the first and second internal clocks CLK_1 and CLK_2. Therefore, the compensation control unit 329 does not activate the compensation finishing signal DCC_END.

Meanwhile, after completing the locking operation and the duty ratio compensating operation through the above-mentioned processes, the first and second internal clocks CLKOUT_1 and CLKOUT_2 are kept in the completed state of the locking and duty ratio compensating operations. Thereafter, the delay locked loop circuit performs an updating process to output the first and second internal clocks CLKOUT_1 and CLKOUT_2 by periodically reflecting a change.

Figure 4:
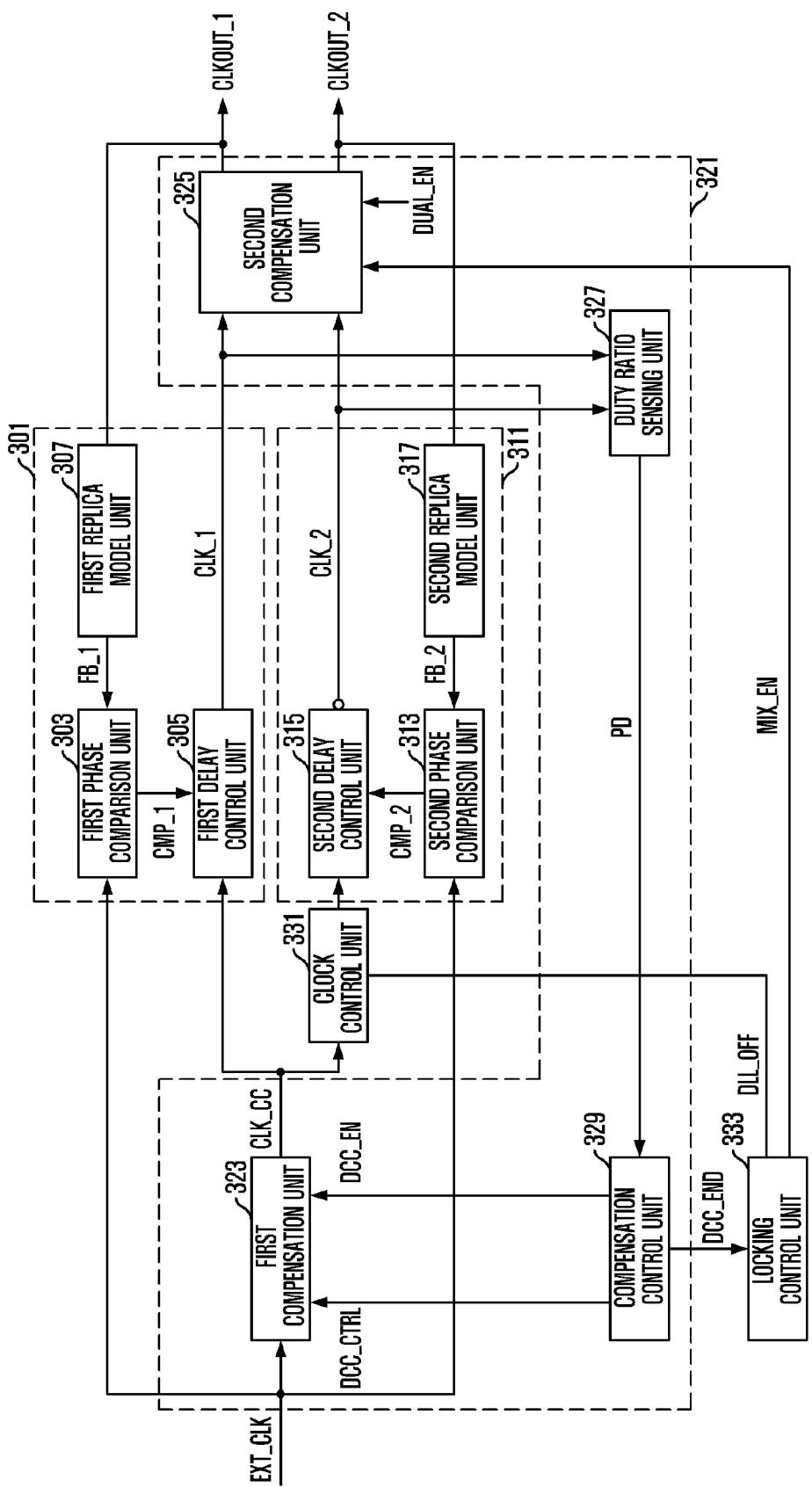
FIG. 4 is a block diagram showing a delay locked loop circuit in accordance with another embodiment of the present invention.

FIG. 4 is a block diagram showing a delay locked loop circuit in accordance with another embodiment of the present invention.

The delay locked loop circuit of FIG. 4 further includes a locking control unit 333 in comparison with the delay locked loop circuit shown in FIG. 3. The locking control unit 333 receives both the dual compensation signal DUAL_EN and the compensation finishing signal DCC_END in order to control both the clock control unit 331 and the second compensation unit 325. While the clock control unit 331 shown in FIG. 3 is controlled by the compensation finishing signal DCC_END, the clock control unit 331 shown in FIG. 4 is controlled by a clock control signal DLL_OFF generated by the locking control unit 333. Further, the second compensation unit 325 is controlled by a mix signal MIX_EN generated by the locking control unit 333.

Figure 5:
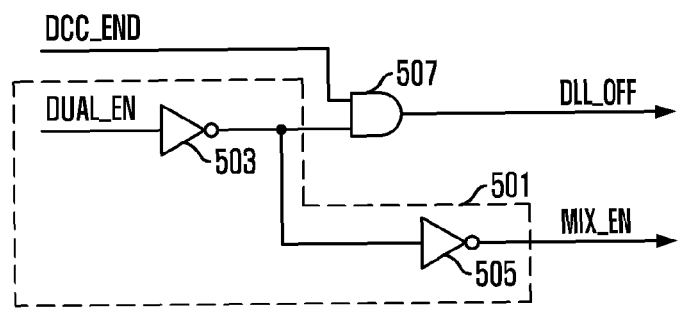
FIG. 5 is a detailed block diagram illustrating a locking control unit shown in FIG. 4.

A detailed operation of the locking control unit 333 will be described referring to FIG. 5. The locking control unit 333 includes a first control unit 501 and a second control unit 507.

The first control unit 501 controls the second compensation unit 325. The first control unit 501 receives the dual compensation signal DUAL_EN in order to output the mix signal MIX_EN for controlling the second compensation unit 325 to the second compensation unit 325. If the dual compensation signal DUAL_EN is activated by two inverters 503 and 505, the mix signal MIX_EN is also activated, and, if the dual compensation signal DUAL_EN is deactivated, the mix signal MIX_EN is also deactivated.

The second control unit 507 controls the clock control unit 331. In one embodiment, the second control unit 507 can be constructed with an AND gate. By receiving the compensation finishing signal DCC_END and an inverted version of the dual compensation signal DUAL_EN, the second control unit 507 activates the clock control signal DLL_OFF at a high level only when the compensation finishing signal DCC_END is activated at a high level and the dual compensation signal DUAL_EN is deactivated at a low level. In the activated state of the dual compensation signal DUAL_EN, the clock control signal DLL_OFF is deactivated at a low level so that the second compensation unit 325 can compensate duty ratios of the first and second internal clocks CLK_1 and CLK_2.

Figure 6:
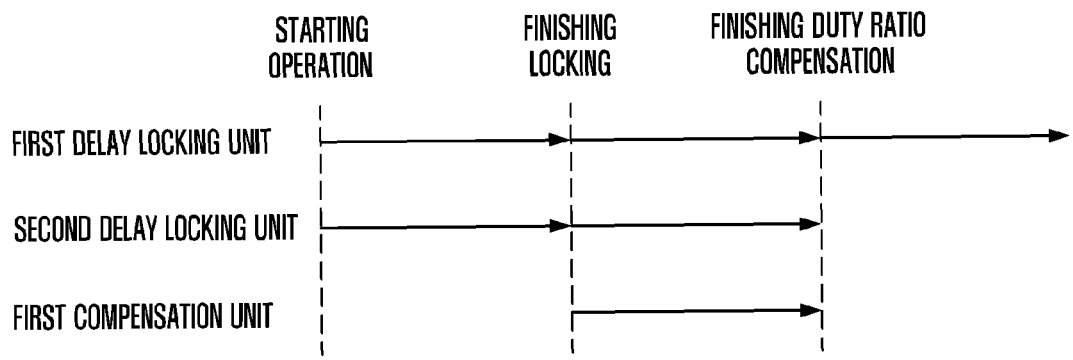
FIG. 6 is a diagram illustrating operations of the delay locked loop circuits shown in FIGS. 3 and 4.

FIG. 6 is a diagram illustrating operations of the delay locked loop circuits shown in FIGS. 3 and 4 for explaining the case that the dual compensation signal DUAL_EN is deactivated. The arrow indicates an enablement of each unit at each operation step of the delay locked loop circuit.

If the operation of the delay locked loop circuit is started, the first and second internal clocks CLK_1 and CLK_2 are delay-locked by the first and second delay locking units 301 and 311 respectively. Thereafter, the duty ratio compensating operation is performed by the first compensation unit 323. Since the first and second delay locking units 301 and 311 are enabled even after the locking operation, the duty ratio sensing unit 327 generates the detection signal PD by detecting duty ratios of the first and second internal clocks CLK_1 and CLK_2, and the first compensation unit 323 compensates a duty ratio of the external clock EXT_CLK in response to the control signal DCC_CTRL.

Figure 1:
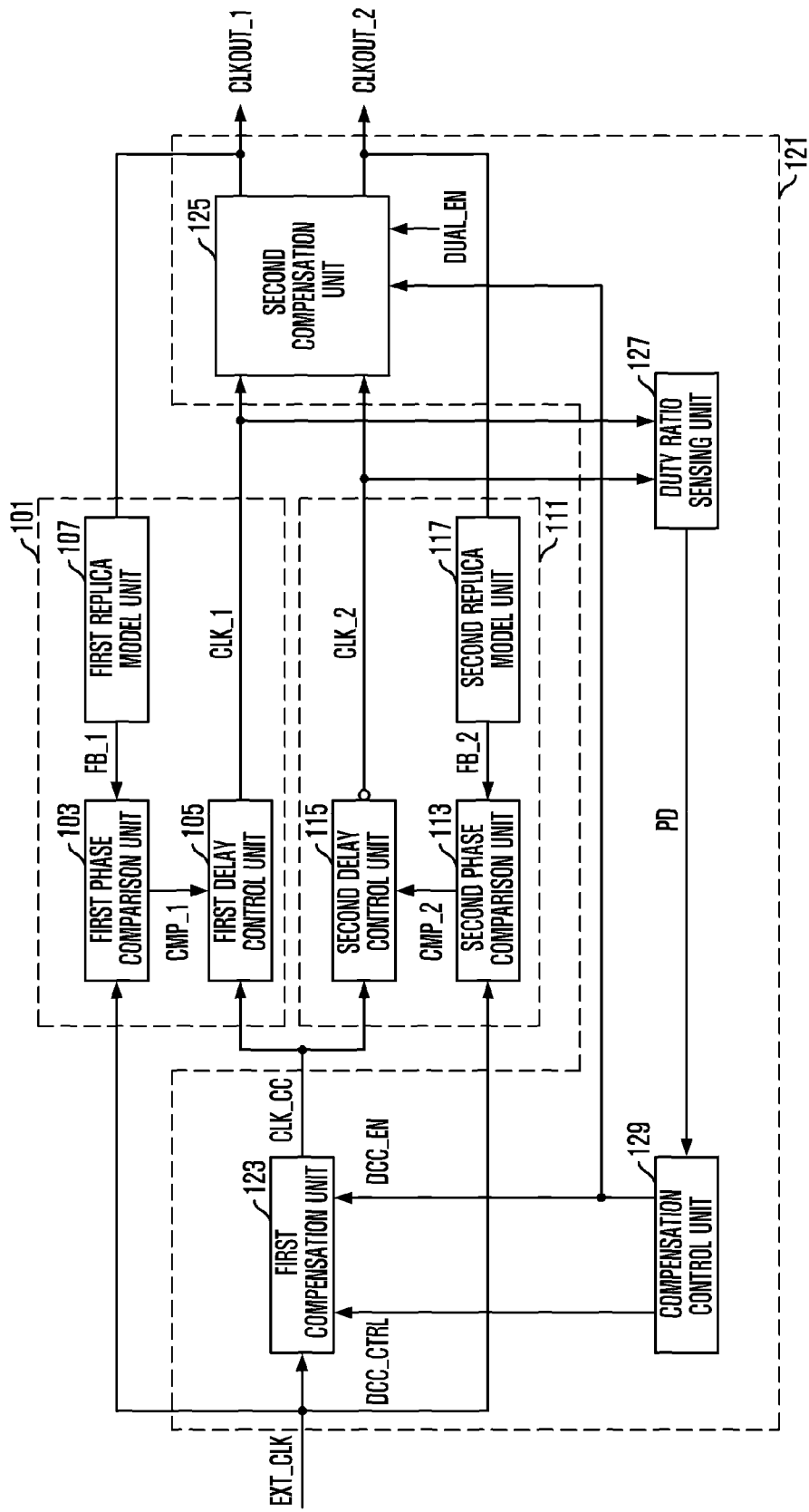
FIG. 1 is a block diagram depicting a conventional delay locked loop circuit.
Figure 2:
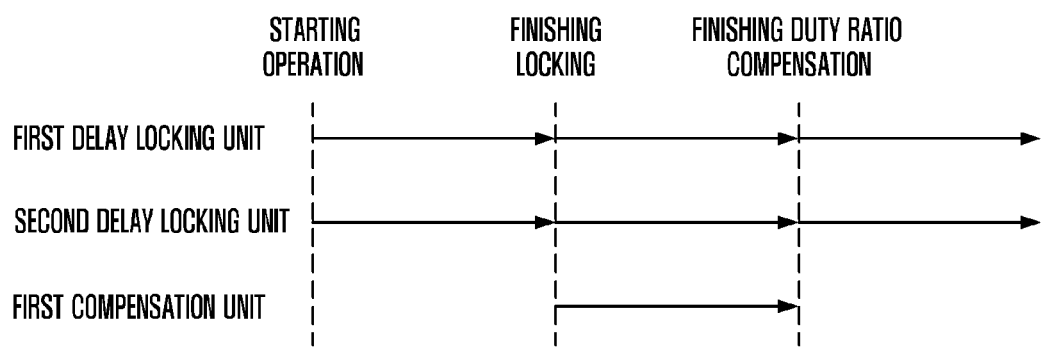
FIG. 2 is a diagram illustrating an operation of the conventional delay locked loop circuit shown in FIG. 1

In case that the duty ratio compensating operation is completed, the clock control unit 331 disables toggling of the compensated external clock CLK_CC inputted to the second delay control unit 315 in response to the compensation finishing signal DCC_END or the clock control signal DLL_OFF. Accordingly, in comparison with the operation shown in FIG. 2, it is shown in FIG. 6 that the second delay locking unit 311 is disabled after the duty ratio compensating operation is completed, and, according to the disablement of the second delay locking unit 311, there is an effect that the power consumption of the delay locked loop circuit in accordance with the present invention is reduced.

In accordance with the present invention, by disabling the second delay locking unit after completing the duty ratio compensating operation, the power consumed by the delay locked loop circuit can be reduced.

While the present invention has been described with respect to the specific embodiments, it will be apparent to those skilled in the art that various changes and modifications may be made without departing from the spirit and scope of the invention as defined in the following claims.

What is claimed is:

1. A delay locked loop circuit, comprising:
    a delay locking unit configured to output a first internal clock and a second internal clock, wherein a rising edge of the second internal clock is synchronized with that of the first internal clock by delaying a compensated external clock to compensate a skew of a semiconductor memory device;
    a duty ratio compensation unit configured to generate the compensated external clock by compensating a duty ratio of an external clock of the semiconductor memory device and to compensate duty ratios of the first and second internal clocks; and
    a clock control unit configured to control an activation state of the second internal clock after the duty ratio compensation of the external clock.

2. The delay locked loop circuit of claim 1, wherein the delay locking unit includes:
    a first delay locking unit configured to output the first internal clock in response to a result of a first comparison of phase between the compensated external clock and a first feedback clock reflected by a delay modeling of the semiconductor memory device; and
    a second delay locking unit configured to output the second internal clock by inverting the compensated external clock after delaying the compensated external clock in response to a result of a second comparison of phase between the compensated external clock and a second feedback clock.

3. The delay locked loop circuit of claim 2, wherein the duty ratio compensation unit compensates duty ratios of the first and second internal clocks in response to a dual compensation signal.

4. The delay locked loop circuit of claim 3, wherein the clock control unit disables toggling of the compensated external clock inputted to the second delay locking unit if the dual compensation signal is deactivated.

5. The delay locked loop circuit of claim 4, wherein the duty ratio compensation unit includes:

a first compensation unit configured to output the compensated external clock by compensating a duty ratio of the external clock in response to a detection signal and a compensation signal;

a second compensation unit configured to mix phases of the first and second internal clocks in response to the compensation signal and the dual compensation signal;

a sensing unit configured to generate the detection signal by detecting the duty ratios of the first and second internal clocks; and a compensation control unit configured to generate the compensation signal which enables the first and second compensation units after a locking of the delay locking unit.

6. The delay locked loop circuit of claim 5, wherein the compensation control unit enables the locking control unit in response to the detection signal.

7. The delay locked loop circuit of claim 5, wherein the first compensation unit drives the external clock if disabled.

8. The delay locked loop circuit of claim 5, wherein the first compensation unit generates the compensated external clock regardless of the detection signal after completion of the duty ratio compensation.

9. The delay locked loop circuit of claim 5, wherein the second compensation unit drives each of the first and second internal clocks if disabled.

10. A delay locked loop circuit, comprising:
a delay locking unit configured to output a first internal clock and a second internal clock, wherein a rising edge of the second internal clock is synchronized with that of the first internal clock by delaying a compensated external clock for compensating a skew of a semiconductor memory device; and a duty ratio compensation unit configured to generate the compensated external clock by compensating a duty ratio of an external clock of the semiconductor memory device and to compensate duty ratios of the first and second internal clocks, wherein the delay locking unit deactivates the second internal clock after compensating the duty ratio of the external clock.

11. The delay locked loop circuit of claim 10, wherein the delay locking unit includes:
a first delay locking unit configured to output the first internal clock in response to a result of a comparison of phase as between the compensated external clock and a first feedback clock reflected by a delay modeling of the semiconductor memory device;

a second delay locking unit configured to output the second internal clock by inverting the compensated external clock after delaying the compensated external clock in response to a result of a comparison of phase between the compensated external clock and a second feedback clock; and a clock control unit configured to disable toggling of the compensated external clock inputted to the second delay locking unit after compensating the duty ratio of the external clock.

12. The delay locked loop circuit of claim 10, wherein the duty ratio compensation unit includes:
a first compensation unit configured to output the compensated external clock by compensating a duty ratio of the external clock in response to a detection signal and a compensation signal;

a second compensation unit configured to mix phases of the first and second internal clocks in response to the compensation signal and the dual compensation signal;

a sensing unit configured to generate the detection signal by detecting duty ratios of the first and second internal clocks; and a compensation control unit configured to generate the compensation signal which enables the compensation unit after a locking of the delay locking unit.

13. The delay locked loop circuit of claim 12, wherein the clock control unit is enabled if the dual compensation signal is deactivated.

* * * * *